(12) United States Patent
Tan

(10) Patent No.: US 7,535,724 B2
(45) Date of Patent: May 19, 2009

(54) PRINTED WIRING BOARD AND A METHOD OF MANUFACTURING THE SAME

(75) Inventor: Kunihiro Tan, Sanda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/293,337

(22) Filed: Dec. 1, 2005

(65) Prior Publication Data

US 2006/0113108 A1    Jun. 1, 2006

(30) Foreign Application Priority Data

Dec. 1, 2004    (JP)    ............................. 2004-349199

(51) Int. Cl.
*H05K 7/00*    (2006.01)

(52) U.S. Cl. ...................... 361/760; 174/260

(58) Field of Classification Search ................ 361/760, 361/766, 748; 174/260, 255; 338/309, 320, 338/330
See application file for complete search history.

(56) References Cited

U.S. PATENT DOCUMENTS

| | | | | |
|---|---|---|---|---|
| 3,473,146 A | * | 10/1969 | Mulligan | ..................... 338/293 |
| 3,594,899 A | * | 7/1971 | Hunt et al. | ..................... 29/834 |
| 4,372,037 A | * | 2/1983 | Scapple et al. | ................. 29/613 |
| 4,853,671 A | * | 8/1989 | Iversen et al. | ............... 338/308 |
| 5,039,824 A | * | 8/1991 | Takashima et al. | ............ 174/33 |
| 5,629,553 A | * | 5/1997 | Ikeda et al. | ................. 257/531 |
| 6,061,241 A | * | 5/2000 | Handforth et al. | ........... 361/704 |
| 7,002,430 B2 | * | 2/2006 | Benham et al. | ........... 333/24 R |

FOREIGN PATENT DOCUMENTS

| | | |
|---|---|---|
| JP | S62-165301 | 7/1987 |
| JP | 2000-307052 | 11/2000 |

* cited by examiner

*Primary Examiner*—Javaid Nasri
(74) *Attorney, Agent, or Firm*—Cooper & Dunham, LLP

(57) ABSTRACT

This patent specification describes a printed wiring board which includes an insulating board, a wiring pattern, and a resistor pattern. The wiring pattern includes a metallic material and is formed on the insulating board in a process step. The resistor pattern includes the metallic material and is formed on the insulating board at a time together with the wiring pattern in the process step of the wiring pattern.

14 Claims, 2 Drawing Sheets

PRINTED WIRING BOARD AND A METHOD OF MANUFACTURING THE SAME

This patent specification is based on Japanese patent application No. 2004-349 199 filed on Dec. 1, 2004 in the Japan Patent Office, the entire contents of which are incorporated by reference herein.

FIELD

This patent specification describes a printed wiring board and a method of manufacturing the printed wiring board at a relative low cost.

BACKGROUND

Recently, a variety of compact systems such as a handy phone have been developed using advanced integrated circuits (ICs). A background printed wiring board used in these compact systems is accordingly required to be thin and light. The circuits for the background printed wiring board used in the compact system generally include resistors and capacitors in addition to the ICs. Since a resistor with a high value and a capacitor with a large capacity are commonly big in size and bulky, when such a resistor and a capacitor are required in a circuit, one type of the background printed wiring board has mounted bulky discrete devices thereon.

Another type of the background printed wiring board uses a resistor paste. In this case, the printed wiring board has an adhesive resistor paste serving as a resistant material which is attached in an inner circumference of a through-hole of the printed wiring board using a screen printing method. However, it is difficult to make consistently a resistor element having an appropriate resistance value.

There is an increasing demand to obtain a small wiring board with thin and light resistor elements at a low cost.

SUMMARY

This patent specification describes a novel printed wiring board which includes an insulating board, a wiring pattern formed on the insulating board with metallic materials and a resistor pattern including the metallic materials and formed on the insulating board at a time together with the wiring pattern in the process step of the wiring pattern.

The printed wiring board may include a non coated resistor pattern with a metal coating thereon.

Further, this patent specification describes a novel method for manufacturing a printed wiring board which includes, patterning first and second metallic material layers on opposite sides of an insulating board having through-holes, forming an insulating material by an adhesive on the second metallic material layer, making through-holes in the insulating material, forming a third metallic material layer on the insulating material, patterning the third metallic material layer and coating with metal plating.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
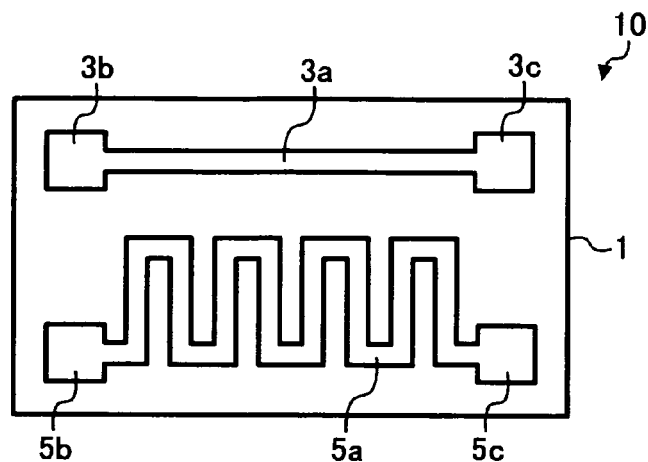
FIG. 1 illustrates a printed wiring board according to an exemplary embodiment.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 1, a printed wiring board 10 according to an exemplary embodiment is described.

FIG. 1 illustrates a top view of the printed wiring board 10. The printed wiring board 10 includes an insulating board 1 which is made of an insulative material such as an epoxy resin. There are several wiring elements formed on the insulating board 1, including a wiring pattern 3a, wiring terminals 3b, 3c, a resistor pattern 5a and resistor terminals 5b, 5c. The wiring terminals 3b and 3c are arranged at opposite ends of the wiring pattern 3a. The resistor terminals 5b and 5c are arranged at opposite ends of the resistor pattern 5a.

The wiring pattern 3a, resistor pattern 5a, wiring terminals 3b, 3c and the resistor terminals 5b, 5c are formed at a same process step with, for example, a copper film having a thickness of 0.017 mm. The width of the wiring pattern 3a and the resistor pattern 5a may be, for example, 0.8 mm. The wiring pattern 3a is formed in a rectangular pattern and the resistor pattern 5a can be formed in a long-way, winding around, meandering shape (an example of which is shown in FIG. 1). In this exemplary embodiment, a distance between terminals 3b and 3c is 20 mm and a distance between terminals 5b and 5c is also 20 mm.

As the wiring pattern has a straight rectangular shape, a length of the wiring pattern 3a is 20 mm. Meanwhile, a length of the resistor pattern 5a is defined by a shortest distance between terminals 5b and 5c and is 200 mm. The resistance of the wiring patterns 3a and the resistor pattern 5a are 0.03Ω and 0.3Ω, respectively. Thus, the resistor pattern 5a can be used as a resistance element.

Table 1 shows a test result of resistance coefficients per unit of cross-sectional area ($\Omega/mm^2$) of copper wirings using a test sample. The test sample includes copper wiring patterns having a straight rectangular shape, a thickness of 0.017 mm, and a length of 200 mm.

From Table 1, it is apparent that a resistor pattern having a desired value can be obtained by determining resistance coefficients (Crc) per unit of cross-sectional area, a length, a width (Ww) and a thickness (Thc) of a wiring. Referring to Table 1, for a resistor having a resistance of, for example, 0.050Ω, the wiring length is 24.78 mm when a wiring width is 0.6 mm. Similarly, the wiring length is 32.98 mm when the wiring width is 0.8 mm. The wiring length is 28.86 mm when the wiring width is 0.7 mm. The wiring length is 32.98 mm when the wiring width is 0.8 mm. The wiring length is 41.53 mm when the wiring width is 1.0 mm.

TABLE 1

| Ww (mm) | R (Ω) | Ru (Ω) | Wuw (mm) | Wlw (mm) | Thc (mm) | Sc (mm$^2$) | Crc (Ω/mm$^2$) |
|---|---|---|---|---|---|---|---|
| 0.8 | 0.3032 | 0.001516 | 0.783 | 0.803 | 0.017 | 0.013481 | 2.043720 × 10$^{-05}$ |
| 1.0 | 0.2413 | 0.001207 | 0.985 | 1.002 | 0.017 | 0.016890 | 2.037718 × 10$^{-05}$ |
| 1.5 | 0.1599 | 0.000800 | 1.488 | 1.510 | 0.017 | 0.025483 | 2.037366 × 10$^{-05}$ |
| 0.8 | 0.3030 | 0.001515 | 0.785 | 0.804 | 0.017 | 0.013507 | 2.046235 × 10$^{-05}$ |
| 1.0 | 0.2408 | 0.001204 | 0.986 | 1.001 | 0.017 | 0.016890 | 2.033496 × 10$^{-05}$ |
| 1.5 | 0.1594 | 0.000797 | 1.490 | 1.512 | 0.017 | 0.025517 | 2.033705 × 10$^{-05}$ |
| 0.7 | 0.3464 | 0.001732 | 0.685 | 0.703 | 0.017 | 0.011798 | 2.043720 × 10$^{-05}$ |
| 0.6 | 0.4036 | 0.002018 | 0.585 | 0.603 | 0.017 | 0.010098 | 2.037718 × 10$^{-05}$ |

Ww is a width of wire, R is a value of resistance, Ru is a resistance per 1 mm, Wuw is a width of upper part of wiring, Wlw is a width of lower part of wiring, Thc is a thickness of wire, Sc is a cross-sectional area and Crc is a resistance coefficients per unit of cross-sectional area.

TABLE 2

| | Crc (Ω/mm$^2$) | Wuw (mm) | Wlw (mm) | Thc (mm) | L (mm) | Sc (mm$^2$) | R (Ω) | Var |
|---|---|---|---|---|---|---|---|---|
| Max. | 2.0437 × 10$^{-05}$ | 0.780 | 0.79 | 0.016 | 33 | 0.01256 | 0.0537 | 0.0036 |
| Typ. | 2.0437 × 10$^{-05}$ | 0.785 | 0.80 | 0.017 | 33 | 0.01347 | 0.0501 | 0 |
| Min. | 2.0437 × 10$^{-05}$ | 0.790 | 0.81 | 0.018 | 33 | 0.01440 | 0.0468 | −0.0032 |

Table 2 shows a measurement result of variation of resistance coefficients of the copper wiring pattern per unit of cross-sectional area (Ω/mm$^2$) when a width of wiring is 0.8 mm and a thickness (Thc) of wiring is 0.017 mm.

Crc is a resistance coefficients per unit of cross-sectional are, Wuw is a width of upper part of wiring, Wlw is a width of lower part of wiring, Thc is a thickness of wire, Sc is a cross-sectional area, L is a length of wiring, Sc is a cross-sectional area, R is a value of resistance and Var is a variation from the typical value.

FIGS. 2A to 2D illustrate a three-layered printed wiring board 20 according to another exemplary embodiment, having a three-layer structure. For simplicity sake, FIGS. 2A to 2D illustrate a part of the three-layered printed wiring board 20 with an exemplary resistor element. The three-layered printed wiring board 20 includes the insulating board 1 of FIG. 1 and other circuitry elements described below.

Figure 2A:
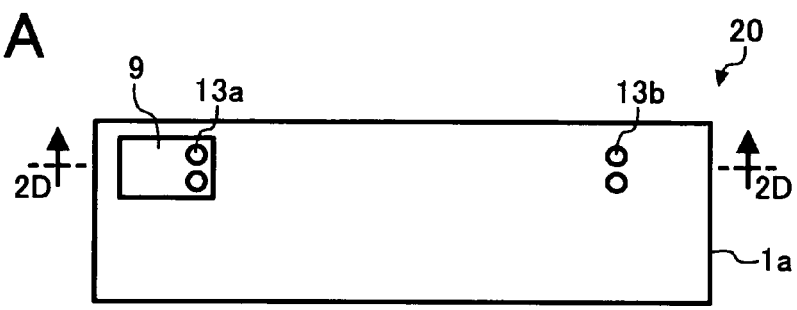
FIGS. 2A to 2D illustrates a printed wiring board having a three layers structure according to another exemplary embodiment.
Figure 2B:
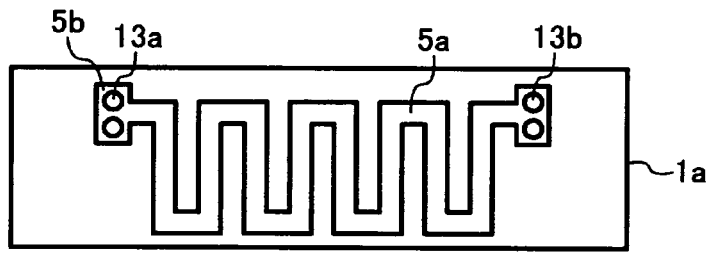
Figure 2C:
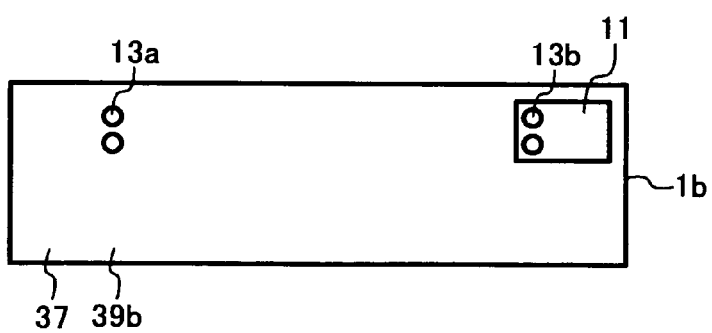
Figure 2D:
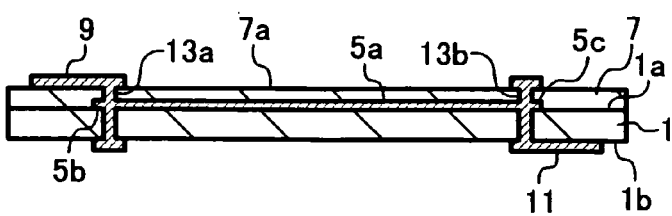

FIG. 2A illustrates a top view of a first wiring layer of the printed wiring board 20. FIG. 2B illustrates a top view of a second wiring layer of the printed wiring board 20. FIG. 2C illustrates a top view of a third wiring layer of the printed wiring board 20. FIG. 2D illustrates a cross sectional view of the printed wiring board 20 seen at a line 2D-2D of FIG. 2A.

In this embodiment, a copper resistor pattern 5a and terminals 5b and 5c both having a thickness of 0.017 mm are formed on a surface 1a of the insulating board 1 which is made of an epoxy resin having a thickness of 0.2 mm. An insulating material 7 which is made of an epoxy resin having a thickness of 0.1 mm is attached by an adhesive on the surface 1a of the insulating board 1.

An electrode 9 made of a copper having a thickness of 0.035 mm is formed on the surface 7a of the insulating material 7. The electrode 9 is arranged at a position corresponding to the terminal 5b of resistor pattern 5a. Another electrode 11 made of a copper having a thickness of 0.035 mm is formed on another surface 1b of the insulating material 7. The electrode 11 is arranged at a position corresponding to the terminal 5c of resistor pattern 5a.

The terminal 5b and the electrode 9 are electrically connected via a through-hole 13a. The terminal 5c and the electrode 11 are electrically connected via a through-hole 13b. The through-holes 13a and 13b are formed as through holes in the insulating board 1 and the insulating material 7.

The through-holes 13a and 13b are coated with copper plating. The electrodes 9 and 11 are also coated with copper plating when the through-holes 13a and 13b are coated. The resistor pattern 5a is not coated with copper plating because it is covered with the insulating board 1 and the insulating material 7 at the copper coating process. Thus, the resistor pattern 5a is formed in the middle layer so that a value of resistance can be obtained with a desired value.

In this exemplary embodiment, while the printed wiring board having a three-metal-layer structure is disclosed as shown in FIGS. 2A to 2D, this is also applicable to other structures such as a four-layer structure. If a requisite value of resistance can be a rough value, a coated wiring pattern, which is coated at the copper coating process, can be used as a resistor.

Figure 3:
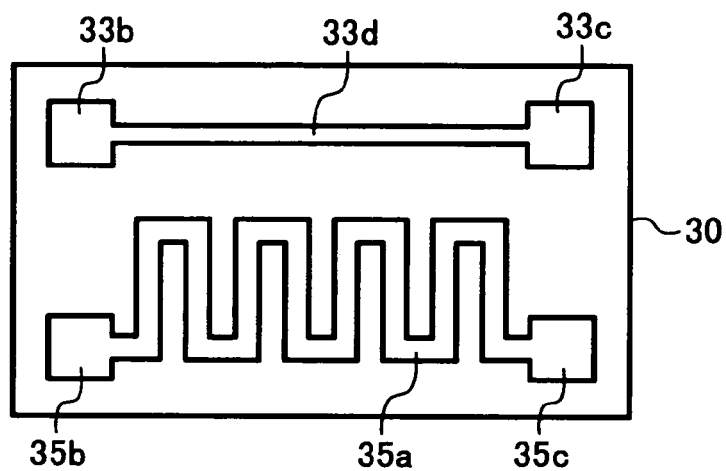
FIG. 3 illustrates a printed wiring board according to another exemplary embodiment.

FIG. 3 illustrates a printed wiring board 30 according to another exemplary embodiment. The printed wiring board 30 includes the insulating board 1 and various electrical elements including a wiring pattern 33d, terminals 33b and 33c, resistor pattern 35a, and resistance terminals 35b and 35c. Each of these electrical elements includes a copper material and has a thickness of 0.017 mm. These electrical elements are formed at a time in a common process step.

A width of the wiring pattern 33d is in the range of from approximately 0.1 mm to approximately 0.3 mm, and a width of the resistor pattern 35a is 0.8 mm which is wider than the wiring pattern 33d. The wiring pattern 33d has a simple straight line shape, while the resistor pattern 35a may be formed in a long-way, winding about, meandering shape so as to obtain a higher resistance within a limited area.

A variation of the resistance value caused by a manufacturing process is one of problems to obtain consistently a resistance with a desired value. Designing a resistor pattern 35a wider than wiring pattern 33d is one of solutions to reduce the variation of the resistance values. When a width of the resistor pattern 35a is wider than other patterns such as wiring the pattern 33d, a variation of the resistance value is much smaller as compared to a variation when a resistance pattern is formed with the same size of other wiring patterns. Namely, it is possible to obtain a desired resistance with an acceptable range of the variation by defining the width of the resistance pattern.

A value of resistance of the resistor pattern 35a is affected by elements such as a length and a cross-section area of the resistor pattern 35a. The cross-section area of the resistance pattern is defined by a thickness and a width of resistor pattern 35a. The thickness is thinner and is in the range of from approximately 0.01 mm to approximately 0.02 mm. The film of the patterns can be formed uniformly at the manufacturing process. By this reason, the deviation of the thickness of the film is relatively small. However, the width is in the range of from approximately 0.1 mm to approximately 0.3 mm and is strongly affected by the manufacturing process. Therefore, it is needed to design the width wide enough to obtain an acceptable value of the resistance within a tolerance.

In this exemplary embodiment, the resistor pattern having a long-way, winding about, meandering shape is disclosed as shown in FIG. 3. The resistor pattern may have other shapes such as a straight pattern and a winding pattern. Moreover, ends of the resistor pattern 35a are connected to the resistance terminals 35b and 35c as shown in FIG. 3. However, the ends may be connected to other wiring pattern. Furthermore, copper is used as a wiring material in this example. However, other metal may also be used.

Figure 4:
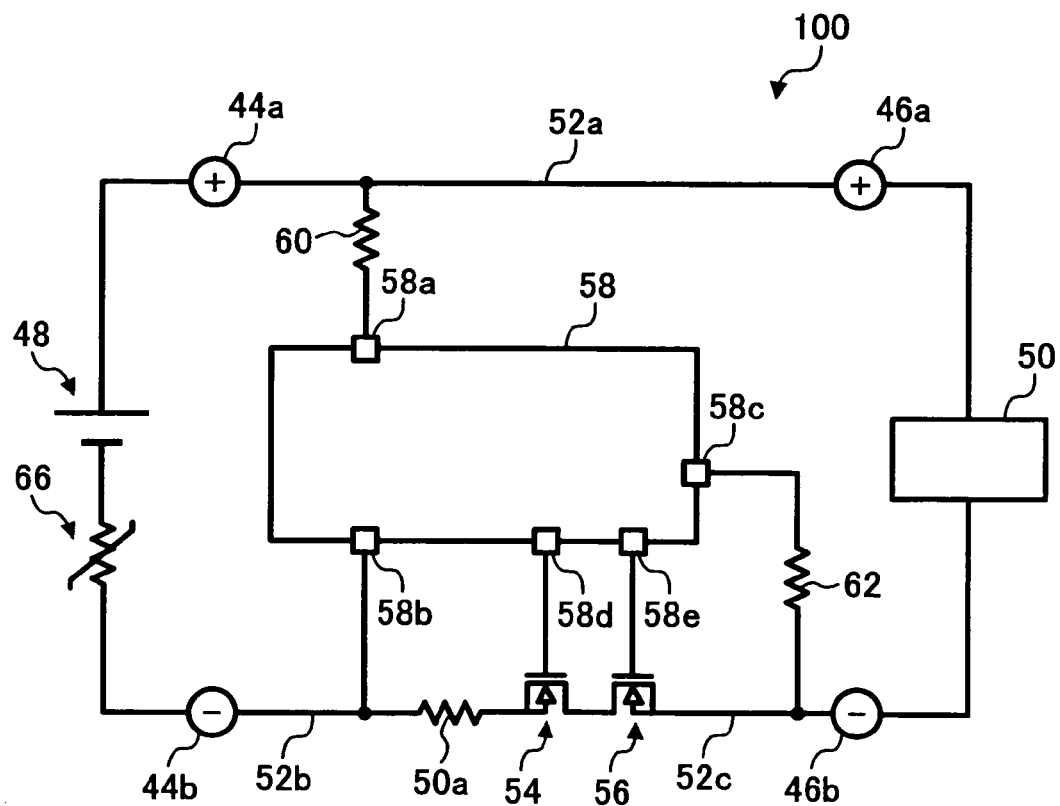
FIG. 4 illustrates an example of an application of the printed wiring board of FIG. 1 in a protection circuit module including for a secondary battery.

FIG. 4 illustrates an exemplary embodiment of a protection circuit module 100 for a secondary battery 48. The protection circuit module 100 includes a protection IC 58, current limiting transistors 54 and 56, resistors 60, 62 and 50a, a plus wiring 52a, a minus wiring 52b, a minus input wiring 52c, and outer terminals 44a, 44b, 46a, and 46b. The secondary battery 48 is connected to the outer terminals 44a and 44b at a battery side. An external device 50 is connected to the outer terminals 46a and 46b at a load side of the protection circuit module 100.

The plus wiring 52a connects the outer terminals 44a at the battery side to the outer terminals 46a at the load side. The minus wiring 52b connects the protection IC to the outer terminals 44b at the battery side. The minus wiring 52b, a resistor pattern 50a and the current limiting transistors 54 and 56 are connected in series. The current limiting transistors 54 and 56 may be configured as MOS (Metal oxide semiconductor) transistors.

The protection IC 58 has a power terminal 58a, a ground terminal 58b, a minus potential input terminal 58c, an output terminal of over-discharge detection 58d and an output terminal of over-charge detection 58e. The power terminal 58a is connected to the plus wiring 52a through a resistor 60.

The ground terminal 58b is connected to the minus wiring 52b, which is arranged between the outer terminals 44b and the current limiting transistors 54. The minus potential input terminal 58c is connected to the minus input wiring 52c which is arranged between the outer terminals 46b and the current limiting transistors 56 through the resistor 62.

The output terminal of over-discharge detection 58d is connected to the gate of the current limiting transistors 54. The output terminal of over-charge detection 58e is the gate of the current limiting transistors 56. A PTC (Positive Temperature Coefficient) element may be connected serially between outer terminals 44b and the secondary battery 48 to make a temperature dependence of the circuit stable. The resistance of the resistor pattern 50a is 5.5Ω and the resistances of the current limiting transistors 54 and 56 are 3.0Ω at their ON state. The total resistance between 44b and 46b can be adjusted by defining the value of the resistor pattern 50a formed on the printed wiring board.

Numerous additional modifications and variations are possible in light of the above teachings. It is therefore to be understood that within the scope of the appended claims, the disclosure of this patent specification may be practiced otherwise than as specifically described herein. For example, elements and/or features of different illustrative embodiments may be combined with each other and/or substituted for each other within the scope of this disclosure and appended claims.

What is claimed is:

1. A printed wiring board comprising;
   an insulating board;
   a wiring pattern configured from a first pattern of a film including metallic materials formed on the insulating board; and
   a resistor pattern configured from a second pattern of said film on the insulating board, said second pattern including the same metallic materials as the first pattern and not overlapping with said first pattern,
   wherein said wiring pattern includes first wiring terminals and said resistor pattern includes second resistor terminals distinct from said first wiring terminals, and
   wherein said resistor pattern is a resistance element terminated by said second resistor terminals and having a predetermined resistance to current flowing between the second resistor terminals, the predetermined resistance of the resistor pattern being independent of the wiring pattern and substantially greater than resistance of said wiring pattern.

2. The printed wiring board of claim 1, wherein the resistor pattern includes no metal coating thereon.

3. The printed wiring board of claim 1, wherein the resistor pattern is formed in a meandering shape.

4. The printing wiring board of claim 1, wherein the resistor pattern is wider than the wiring pattern.

5. The printing wiring board of claim 1, wherein a thickness of the wiring pattern is substantially the same as a thickness of the resistor pattern.

6. The printing wiring board of claim 1, wherein a width of the resistor pattern is substantially the same throughout a length of the resistor pattern.

7. The printing wiring board of claim 1, wherein the wiring pattern has a first width that is substantially the same throughout a length of the wiring pattern, the resistor pattern has a second width that is substantially the same throughout a length of the resistor pattern, and the second width of the resistor pattern is substantially greater than the first width of the wiring pattern.

8. A printed wiring board comprising:
   an insulating board;
   a wiring pattern including metallic materials configured from a first pattern of a film formed on the insulating board;
   a resistor pattern configured from a second pattern of said film, said second pattern including the same metallic materials as the first pattern not overlapping with said first pattern; and
   a first pair of wiring terminals at respective ends of the wiring pattern, and a second pair of resistor terminals at respective ends of the resistor pattern, the second pair of resistor terminals being distinct from said first pair of wiring terminals, wherein said resistor pattern is a resistance element terminated by said second pair of resistor terminals and having a predetermined resistance to current flowing between the pair of resistor terminals, the predetermined resistance of the resistor pattern being independent of the wiring pattern and substantially greater than resistance of said wiring pattern, and wherein said predetermined resistance to the current flowing through said resistor pattern is specified by a width, a length and a thickness of said resistor pattern.

9. The printing wiring board of claim 8, wherein a thickness of the wiring pattern is substantially the same as a thickness of the resistor pattern.

10. The printing wiring board of claim 8, wherein a width of the resistor pattern is substantially the same throughout a length of the resistor pattern.

11. The printing wiring board of claim 8, wherein the resistor pattern includes no metal coating thereon.

12. The printing wiring board of claim 8, wherein the resistor pattern is formed in a meandering shape.

13. A printed wiring board comprising:
an insulating board;
a plurality of wiring patterns including one or more patterns configured from a first pattern of a film of metallic materials formed on the insulating board, wherein at least one of said wiring patterns is a resistor configured from a second pattern of said film on said insulating board, said second pattern including the same metallic materials as the first pattern and not overlapping with said first pattern, and wherein said second pattern is a resistance element having a predetermined resistance to current flowing through the second pattern, the predetermined resistance of the second pattern being independent of the wiring pattern and substantially greater than resistance of said first pattern.

14. The printing wiring board of claim 13, wherein the resistor pattern has a cross section area that is substantially greater than a cross section area of the wiring pattern.

* * * * *